(12) United States Patent
Sugiyama et al.

(10) Patent No.: US 8,815,675 B2
(45) Date of Patent: Aug. 26, 2014

(54) METHOD OF MANUFACTURING NONVOLATILE SEMICONDUCTOR MEMORY WITH BACKING WIRINGS

(75) Inventors: Hideki Sugiyama, Kanagawa (JP); Hideki Hara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 308 days.

(21) Appl. No.: 13/324,614

(22) Filed: Dec. 13, 2011

(65) Prior Publication Data

US 2012/0083112 A1 Apr. 5, 2012

Related U.S. Application Data

(62) Division of application No. 11/812,325, filed on Jun. 18, 2007, now abandoned.

(30) Foreign Application Priority Data

Jun. 19, 2006 (JP) .................................. 2006-168537

(51) Int. Cl.
*H01L 31/072* (2012.01)

(52) U.S. Cl.
USPC ............................ 438/201; 438/211; 438/257

(58) Field of Classification Search
USPC .......................................... 438/201, 211, 257
See application file for complete search history.

(56) References Cited

U.S. PATENT DOCUMENTS

| | | | |
|---|---|---|---|
| 6,759,290 B2 | 7/2004 | Ogura et al. | |
| 7,118,961 B2 | 10/2006 | Ogura et al. | |
| 7,245,531 B2 | 7/2007 | Okazaki et al. | |
| 2002/0039822 A1 | 4/2002 | Kusumi et al. | |

FOREIGN PATENT DOCUMENTS

| | | |
|---|---|---|
| JP | 2002-353346 A | 12/2002 |
| JP | 2006-49737 A | 2/2006 |

*Primary Examiner* — Samuel Gebremariam
(74) *Attorney, Agent, or Firm* — Foley & Lardner LLP

(57) ABSTRACT

A nonvolatile semiconductor memory comprises a first memory cell transistor, a second memory cell transistor, a connection layer, protrusion portions and a contact portion. The first memory cell transistor comprises a first gate electrode formed above a first channel region, and a second gate electrode formed on a side of the first gate electrode through an insulating film. The second memory cell transistor comprises a third gate electrode formed above a second channel region, and a fourth gate electrode formed on a side of the third gate electrode through an insulating film and facing the second gate electrode. The connection layer connects the second gate electrode and the fourth gate electrode. The protrusion portions are formed of a material different than that of the second and fourth gate electrodes, and are formed on both ends of the connection layer. The contact portion is formed on the connection layer.

7 Claims, 9 Drawing Sheets

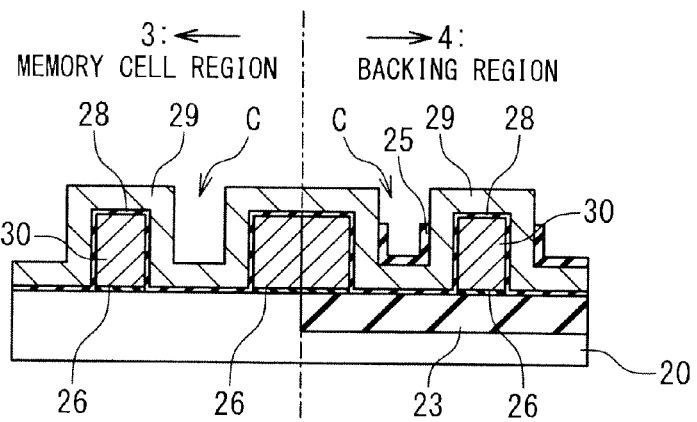
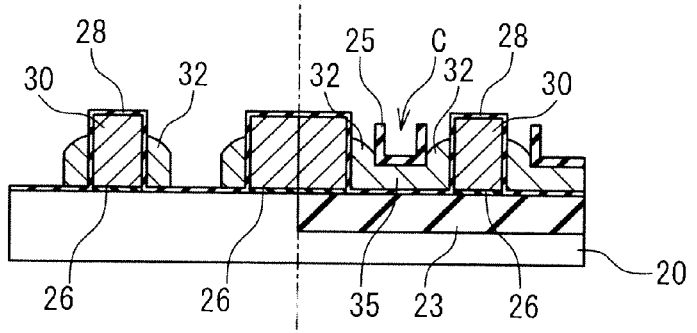
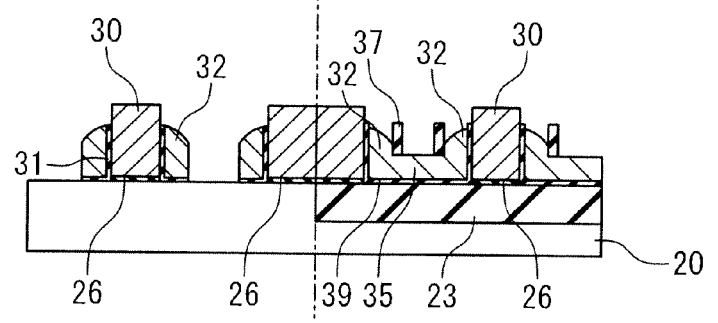

METHOD OF MANUFACTURING NONVOLATILE SEMICONDUCTOR MEMORY WITH BACKING WIRINGS

CROSS-REFERENCE TO RELATED PATENT APPLICATIONS

This application is a division of application Ser. No. 11/812,325, filed Jun. 18, 2007, now pending, which claims the benefit of priority from the prior Japanese Patent Application No. 2006-168537, filed Jun. 19, 2006, the entire contents of which are incorporated herein by reference. This application claims only subject matter disclosed in the parent application and therefore presents no new matter.

BACKGROUND OF THE INVENTION

1. Field of the Invention

The present invention relates to a nonvolatile semiconductor memory with backing wirings and a manufacturing method thereof.

2. Description of Related Art

As typified by a nonvolatile memory cell having a MONOS structure (Metal-Oxide-Nitride-Oxide-Semiconductor structure), a cell structure of a nonvolatile memory has been known in which a control gate electrode is formed on a sidewall of a word gate electrode. For example, Japanese Laid-Open Patent Application JP2002-353346A (claiming priority to U.S. Provisional Patent Application serial No. 60/278,622) discloses a cell structure of a flash memory having a twin MONOS structure. FIG. 1 is a sectional view showing a structure of the memory cell having the twin MONOS structure in JP2002-353346A. A memory cell 101 includes a source/drain diffusion layer 144, a word gate insulating film 126, a word gate electrode 130, a control gate electrode 132, an ONO (Oxide Nitride Oxide) film 131, a sidewall insulating film 142, silicide layers 149, 150 and an LDD (Lightly Doped Drain) diffusion layer 138.

The source/drain diffusion layer 144 is formed on the surface of a semiconductor substrate 120. The word gate insulating film 126 is formed on a channel region disposed between the source/drain diffusions layers 144. The word gate electrode 130 is formed on the channel region through the word gate insulating film 126. The control gate electrode 132 is formed on each of both side surfaces of the word gate electrode 130 through the ONO film 131. The ONO film 131 is formed between the word gate electrode 130 and the control gate electrode 132, and between the control gate electrode 132 and the channel region. The sidewall insulating film 142 is formed on each of both sides of the word gate electrode 130 so as to cover the control gate electrode 132. The silicide layers 149, 150 are formed on the word gate electrode 130 and the source/drain diffusion layer 144, respectively. The LDD diffusion layer 138 is formed on the channel region immediately below the sidewall insulating film 142.

Memory cells 101a, 101b are placed on an extension of the memory cell 101 and have a memory cell structure. However, the memory cells 101a, 101b are provided on a isolation region 123 in order to have contact between the memory cell 101 and an upper metal wiring. Such contact is provided for the following reason. A resistance of the control gate electrode 132 is high due to a structural factor that the control gate electrode 132 is formed on the side surfaces of the word gate electrode 130 and a material factor that the control gate electrode is made of polysilicon. Therefore, overall wiring resistance needs to be decreased by "backing" with a metal wiring of a low resistance. The memory cell 101a and the memory cell 101b are connected to each other with a connection layer 135 in a state where the adjacent control gate electrodes 132 are not separated from each other at manufacturing. Thus, the control gate electrode 132 is connected to the upper metal wiring (called backing wiring) through the connection layer 135, a silicide layer 151 on the connection layer 135 and a contact 154 on the silicide layer 151. In the memory cell 101a, the word gate electrode 130 is connected to the upper metal wiring (backing wiring) through the silicide layer 149 and a contact 156 on the silicide layer 149.

We have now discovered the facts that will be described below with reference to attached drawings. Although JP2002-353346A does not disclose the manufacturing method in detail, it is considered from technical common sense that the manufacturing method includes a following manufacturing step. FIGS. 2A to 2B are sectional views each showing a part of a manufacturing step of the memory cell having the disclosed twin MONOS structure. In FIGS. 2A to 2B, a left side of an alternate long and short dash line shows a memory cell region 3 of a nonvolatile semiconductor memory. A right side of the alternate long and short dash line shows a backing region 4 of the nonvolatile semiconductor memory 10. Referring to FIG. 2A, in a memory cell region 3 where the memory cell 101 is formed, the word gate insulating film 126 and the word gate electrode 130 are formed on the semiconductor substrate 120. In a backing region 4 where the memory cells 101a, 101b are formed, the word gate insulating film 126 and the word gate electrode 130 are formed on the isolation region 123 of the semiconductor substrate 120. Then, an ONO film 128 and a polysilicon film 129 are formed so as to cover surfaces of the semiconductor substrate 120 and the word gate electrode 130. Next, in the backing region, a hard mask 125 is formed on a lower region of the polysilicon film 129 between the adjacent word gate electrodes 130. Silicon oxide may be used as the hard mask 125.

Referring to FIG. 2B, the polysilicon film 129 is etched back to remove the polysilicon film 129 except for the area in the vicinity of the side surfaces of the word gate electrode 130. The control gate electrode 132 is formed in this manner. At this time, in the backing region, the polysilicon film 129 between the adjacent control gate electrodes 132, which is protected with the hard mask 125 and is not removed, becomes the connection layer 135. Then, using the word gate electrode 130 and the control gate electrode 132 as masks, the ONO film 128 is formed to the ONO film 131 by etching. In this manner, the ONO film 131 is formed between the word gate electrode 130 and the control gate electrode 132, and between the semiconductor substrate 120 and the control gate electrode 132. In the backing region, the ONO film 128 between the adjacent control gate electrodes 132 which is protected with the connection layer 135 and is not removed becomes an ONO film 139. The hard mask 125 is removed by etching of the ONO film 128.

FIG. 3 is an enlarged sectional view of periphery of the control gate electrode 132 in FIG. 2B. When the polysilicon film 129 is etched in the manufacturing step, a kink 160 occurs in the vicinity of an end of the hard mask 125 between the part which becomes the control gate electrode 132 and the part which becomes the connection layer 135. This is due to when the polysilicon film 129 is etched, a boundary between the control gate electrode 132 and the connection layer 135 is insufficiently protected, resulting in the progress of etching. The kink 160 forces connection between the control gate electrode 132 and the connection layer 135 to have a remarkable high resistance or, in the worst case, to be broken. As a result, the function of the backing for reducing overall wiring resistance by connecting the control gate electrode 132 to the metal wiring cannot be achieved.

By making the thickness of the hard mask 125 relatively large, the occurrence of the kink 160 can be prevented. However, even after etching of the ONO film 128, the thick hard mask 125 still remains. When only a small amount of the hard mask 125 remains, the slicide can not be formed on the connection layer 135 in a subsequent step. As a result, unless the hard mask 125 is completely removed in an additional special step, the resistance between the connection layer 135 and the contact 154 increases. Therefore, there is a demand for the technique capable of preventing the kink from occurring between the control gate electrode and the polysilicon film extended between the control gate electrodes and forming the satisfactory backing wiring structure.

SUMMARY

The present invention seeks to solve one or more of the above problems, or to improve upon those problems at least in part. In one embodiment, a manufacturing method of a nonvolatile semiconductor memory includes: (a) laminating a second insulating film, a gate film and a hard mask film which cover a first gate electrode of a first memory cell transistor formed on a first region of a semiconductor substrate through a first insulating layer and a third gate electrode of a second memory cell transistor formed on a second region of the semiconductor substrate through the first insulating layer; (b) forming a first hard mask layer which covers a bottom portion and a side surface of a concave portion formed using the gate film between the first gate electrode and the third gate electrode by etching the hard mask film; (c) forming a second gate electrode of the first memory cell transistor on the first region, a fourth gate electrode of the second memory cell transistor on the second region, and a connection layer which connects the second gate electrode and the fourth gate electrode under the first hard mask layer by etching the gate film; and (d) exposing upper portions of the first gate electrode, the third gate electrode and the connection layer by etching back the second insulating film and the first hard mask layer covering a bottom portion of the concave portion to remain the first hard mask layer such that the first hard mask layer covers side surfaces of the concave portion.

In the present invention, at the step (b), the first hard mask layer is formed, which covers the bottom portion and the side surface of the concave portion formed using the gate film between the first gate electrode and the third gate electrode. Although this first hard mask layer is thin, it has not only the bottom portion but also a sidewall (protrusion which covers the side of the concave portion) rising from the bottom portion. At the step (c), this sidewall (protrusion) achieve the same effect as the fact that the thickness of the first hard mask layer becomes thick with respect to the gate film. That is, since a region contacting the sidewall (protrusion) and the gate film becomes wider than before, etching at the boundary region between a portion to be the connection layer and potions to be the second and fourth gate electrodes is hard to proceed. As a result, it is possible to prevent occurrence of the kink (the kink 160 in FIG. 3) due to etching at the region. In addition, since the thickness of the first hard mask layer only needs to be relatively thin, at the same time as etching back of the second insulating film at the step (d), the upper surface of the connection layer can be exposed. Thereby, the silicide layer can be formed on the upper surface of the connection layer at a subsequent step without adding any special step.

According to the present invention, it is possible to prevent a kink from occurring between a connection layer extended between a second gate electrode and a fourth gate electrode, and the second gate electrode and the fourth gate electrode, respectively, to form the satisfactory backing wiring structure.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 9A to 9C are sectional views each showing step of the embodiment of the manufacturing method of the nonvolatile semiconductor memory according to the present invention.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 4:
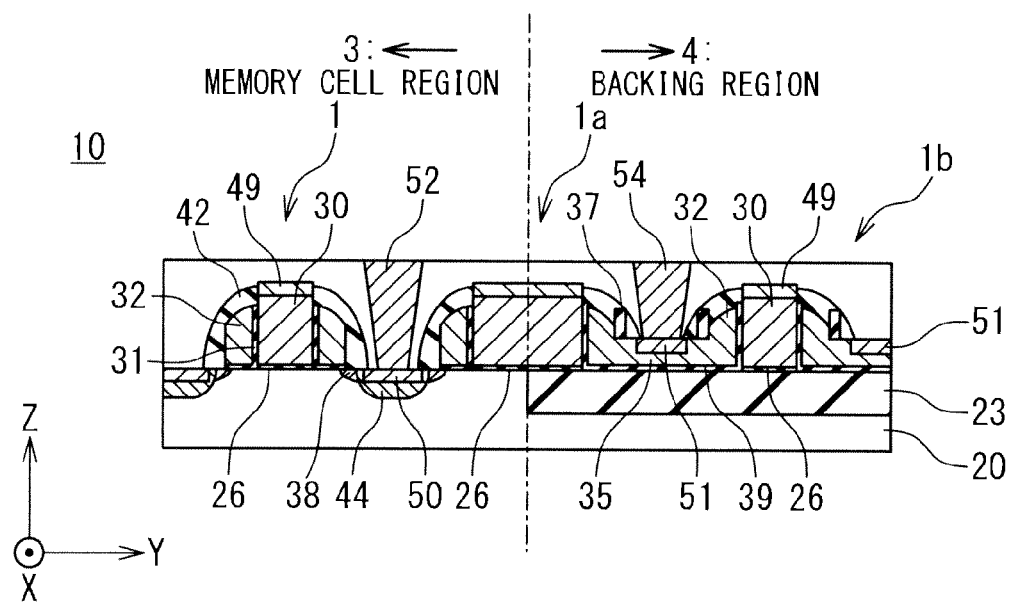
FIG. 4 is a sectional view showing a structure of an embodiment of a nonvolatile semiconductor memory according to the present invention.

Embodiments of a nonvolatile semiconductor memory according to the present invention will be described below with reference to the attached drawings. FIG. 4 is a sectional view showing a structure of an embodiment of the nonvolatile semiconductor memory according to the present invention. In FIG. 4, a left side of an alternate long and short dash line shows a memory cell region 3 of a nonvolatile semiconductor memory 10 and illustrates a memory cell 1. A right side of the alternate long and short dash line shows a backing region 4 of the nonvolatile semiconductor memory 10 and illustrates memory cells 1*a*, 1*b*. The memory cell region 3 and the backing region 4 are formed on a same semiconductor substrate 20.

The memory cell 1 includes a source/drain diffusion layer 44, a word gate insulating film 26, a word gate electrode 30, a control gate electrode 32, an ONO (Oxide Nitride Oxide) film 31, a sidewall insulating film 42, silicide layers 49, 50 and an LDD diffusion layer 38.

The source/drain diffusion layer 44 is formed on a surface of the semiconductor substrate 20. As (arsenic) or P (phosphorus) may be used as a dopant of the source/drain diffusion layer 44. The word gate insulating film 26 is formed on a channel region disposed between the source/drain diffusion layers 44. Silicon oxide may be used as the word gate insulating film 26. The word gate electrode 30 is formed on the channel region through the word gate insulating film 26. Polysilicon may be used as the word gate electrode 30. The control gate electrode 32 is formed on each of both side surfaces of the word gate electrode 30 through the ONO film 31. Polysilicon may be used as the control gate electrode 32. The ONO film 31 is formed between the word gate electrode 30 and the control gate electrode 32, and between the control gate electrode 32 and the channel region. A laminated film of silicon oxide, silicon nitride and silicon oxide may be used as the ONO film 31. The sidewall insulating film 42 is formed on each of both sides of the word gate electrode 30 so as to cover the control gate electrode 32. A monolayer film of silicon oxide or a laminated film of silicon oxide, silicon nitride and silicon oxide may be used as the sidewall insulating film 42. The silicide layers 49, 50 are formed on the word gate electrode 30 and the source/drain diffusion layer 44, respectively. Cobalt silicide may be used as the silicide layers 49, 50. The LDD diffusion layer 38 is formed on the channel region immediately under the sidewall insulating film 42. As or P may be used as a dopant. The adjacent control gate electrodes 32 of the memory cell 1 each are surrounded by an insulating layer and are insulated from each other. The source/drain diffusion layer 44 is connected to a bit line through the silicide layer 50 and a contact 52.

The memory cells 1a, 1b are placed on an extension of the memory cell 1 and have a basically same structure as that of the memory cell 1. For example, the word gate electrode 30 and the control gate electrode 32 of the memory cells 1a, 1b are placed on an extension of the word gate electrode 30 and the control gate electrode 32 of the memory cell 1, respectively, in an integrated (unified) manner. However, the electrodes are formed on an isolation region 23 in order to have contact between the memory cell 1 and upper metal wiring for "backing". For this reason, the memory cell 1a and the memory cell 1b do not serve as a memory cell.

The memory cell 1a and the memory cell 1b are connected to each other with a connection layer 35 in a state where the adjacent control gate electrodes 32 are not separated from each other at manufacturing. The connection layer 35 is made of a same material as the control gate electrode 32 and polysilicon may be used as the connection layer 35. Thus, both the control gate electrodes 32 of the memory cell 1a and the memory cell 1b are connected to the upper metal wiring (backing wiring) through the connection layer 35, the silicide layer 51 and a contact 54 on the connection layer 35. Here, the connection layer 35, the silicide layer 51 and a contact 54 on the connection layer 35 form a backing contact structure.

In the memory cell 1a and the memory cell 1b, a protrusion 37 is formed on each of both ends of the connection layer 35. Silicon oxide and/or silicon nitride may be used as the protrusions 37. The protrusions 37 can prevent a kink from being formed in the boundary between the connection layer 35 and the control gate electrode 32 in the below-mentioned manufacturing method. It is more preferred that an upper surface and side surfaces of the control gate electrode 32 are fully covered with the sidewall insulating film 42.

Figure 5:
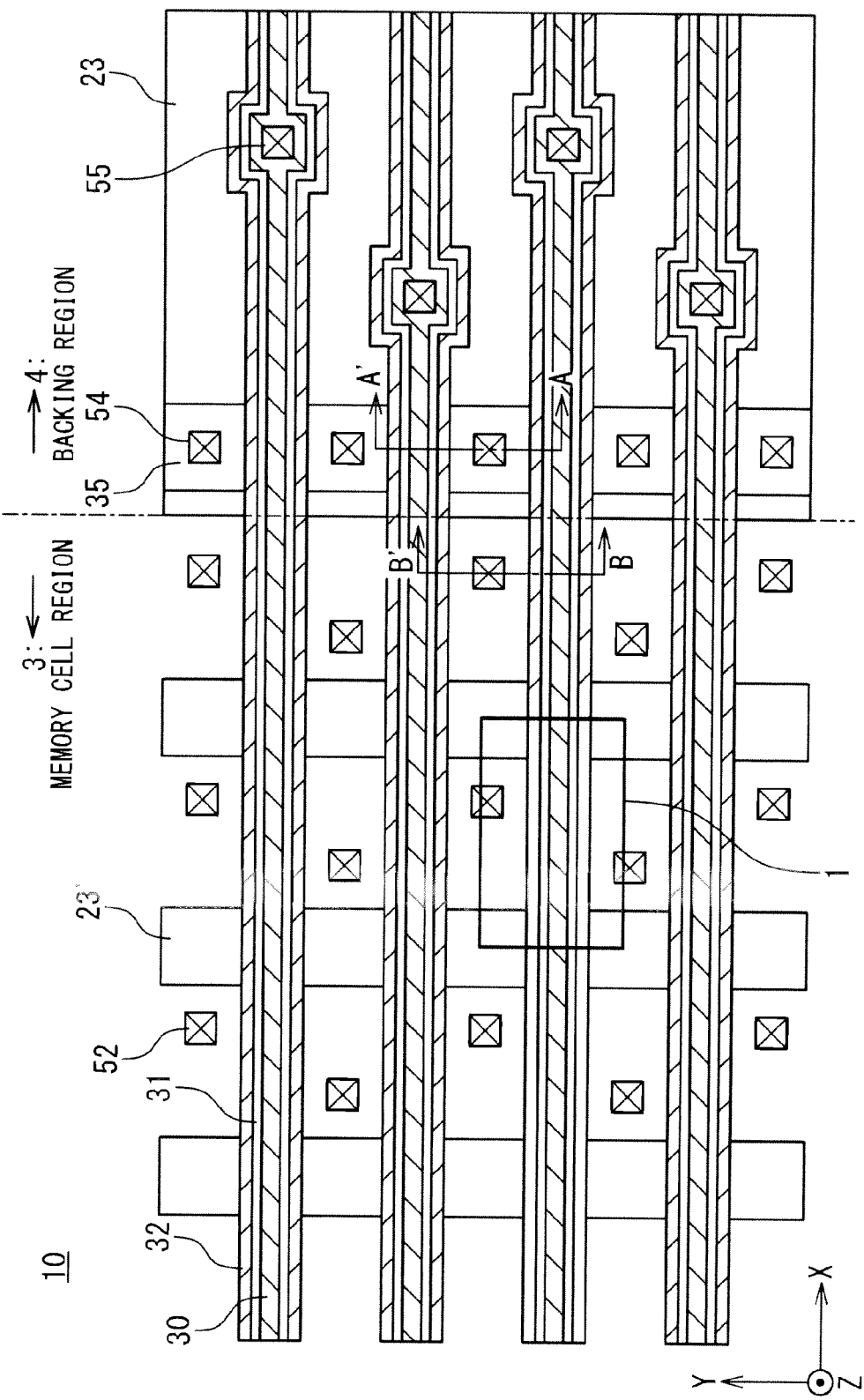
FIG. 5 is a top view showing a structure of the embodiment of the nonvolatile semiconductor memory according to the present invention.

FIG. 5 is a top view showing the structure of the embodiment of the nonvolatile semiconductor memory of the present invention. The memory cell region 3 and the backing region 4 in FIG. 4 show, for example, a cross-section taken along a BB' and a cross-section taken along an AA' in FIG. 5, respectively.

The nonvolatile semiconductor memory 10 includes a plurality of word gate electrodes 30 and a plurality of control gate electrodes 32. Each of the plurality of word gate electrodes 30 extends in the memory cell region 3 and the backing region 4 in an X direction. Each of the plurality of control gate electrodes 32 extends in the memory cell region 3 and the backing region 4 along each of both sides of the word gate electrode 30 via the ONO film 31 in an X direction.

In the memory cell region 3, a plurality of isolation regions 23' which electrically isolate the surface region and extend in a Y direction are formed on the semiconductor substrate 20. The memory cell 1 is a region which is sandwiched between the isolation regions 23' and includes one word gate electrode 30, the control gate electrodes 32 on the both sides of the word gate electrode 30 and its surrounding region (source/drain diffusion layer). For example, the memory cell 1 is a region surrounded by a rectangular frame in FIG. 5. The contact 52 is connected to a bit line (not shown).

In the backing region 4, the isolation region 23 is formed on the surface region of the semiconductor substrate 20. The connection layer 35 extends at intervals while being connected to the adjacent control gate electrode 32. The connection layer 35, which forms the backing contact structure for the control gate electrodes along with the silicide layer 51 and the contact 54, is connected to the upper backing wiring (metal wiring). The backing contact structure for word gate electrode which is formed of the silicide layer 49 and the contact 55 is formed on the word gate electrode 30.

Figure 6:
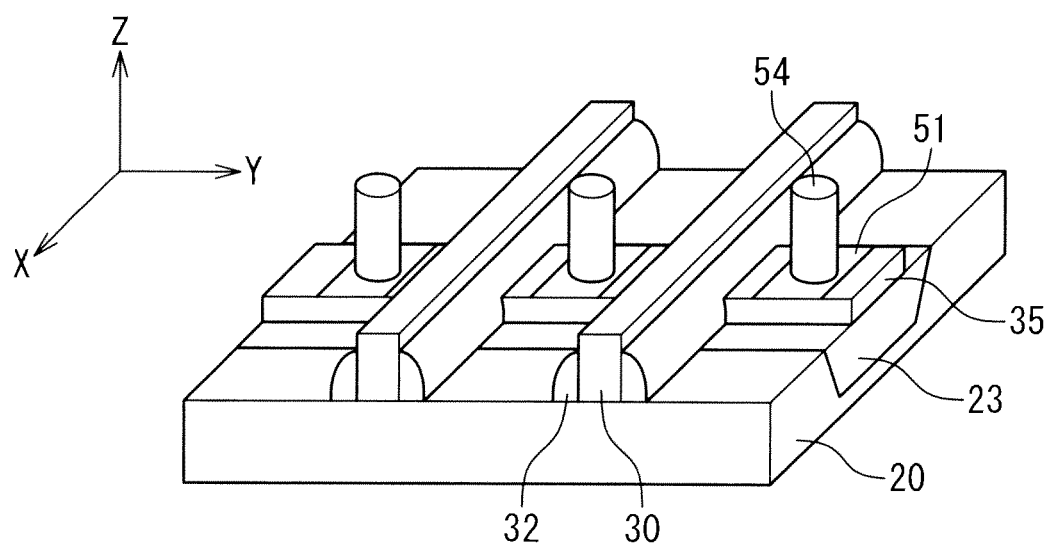
FIG. 6 is a perspective view showing a structure of the embodiment of the nonvolatile semiconductor memory according to the present invention.

FIG. 6 is a perspective view showing the structure of the embodiment of the nonvolatile semiconductor memory of the present invention. FIG. 6 shows the periphery of the backing contact structure in FIG. 5. The connection layer 35, the silicide layer 51 and the contact 54 as the backing contact structure are formed on the isolation region 23 in this order. The backing contact structure couples and electrically connects the adjacent control gate electrode 32 to each other.

Next, referring to FIG. 4, operations of the nonvolatile semiconductor memory in the present embodiment will be described. First, an operation of writing data to the memory cell 1 will be described. A positive voltage of about 1 V is applied to the word gate electrode 30. A positive voltage of about 6 V is applied to the control gate electrode 32 on a side where writing is performed (hereinafter, referred to as "selected-side"), and a positive voltage of about 3 V is applied to the control gate electrode 32 on a side where writing is not performed (hereinafter, referred to as "unselected-side"). Here, the selected-side control gate electrode 32 forms a pair with the unselected-side control gate electrode 32. A positive voltagel of about 5 V is applied to the selected-side source/drain diffusion layer 44 and about 0 V is applied to the unselected-side source/drain diffusion layer 44. Thereby, hot electrons generated in the channel region are injected into the nitride film of the selected-side ONO film 31. This is called as CHE (Channel Hot Electron) injection. Thereby, data is written.

Next, an operation of erasing data written to the memory cell 1 will be described. About 0 V is applied to the word gate electrode 30. A negative voltage of about −3 V is applied to the selected-side control gate electrode 32, and a positive voltage of about 2 V is applied to the unselected-side control gate electrode 32. A positive voltage of about 5 V is applied to the selected-side source/drain diffusion layer 44. As a result, hole electron pairs are generated due to band-to-band tunneling and these holes and/or holes generated by hitting against these holes are accelerated to become hot holes. The hot holes are injected into the nitride film of the selected-side ONO film 31. Thereby, negative charges accumulated in the nitride film of the ONO film 31 are cancelled, erasing data.

Next, an operation of reading data written to the memory cell 1 will be described. A positive voltage of about 2 V is applied to the word gate electrode 30. A positive voltage of about 2 V is applied to the selected-side control gate electrode 32, and a positive voltage of about 3 V is applied to the unselected-side control gate electrode 32. About 0 V is applied to the selected-side source/drain diffusion layer 44 and about 1.5 V is applied to the unselected-side source/drain diffusion layer 44. In this state, a threshold value of the memory cell 1 is detected. The threshold value when negative charges are accumulated in the selected-side ONO film 31 is higher than that when negative charges are not accumulated. Therefore, by detecting the threshold value, the data written to the selected-side ONO film 31 can be read out. In the memory cell 1 shown in FIG. 4, it is possible to store 1-bit data in each of both sides of the word gate electrode 30. That is, 2-bit data are stored in the both sides of the word gate electrode 30.

In each of the above-described operations, an application of voltage to the control gate electrode 32 and accompanying current flow are performed through the above-described backing contact structure for the control gate electrode. Similarly, an application of voltage to the word gate electrode 30 and accompanying current flow are performed through the above-described backing contact structure for the word gate electrode.

Next, an embodiment of a manufacturing method of the nonvolatile semiconductor memory according to the present invention will be described below. FIGS. 7A to 7C, 8A to 8C, 9A to 9C, 10A to 10C are sectional views each showing step of the embodiment of the manufacturing method of the nonvolatile semiconductor memory according to the present invention. In each drawing, the left side from an alternate long and short dash line shows the memory cell region 3 and illustrates a manufacturing step of the memory cell 1. The memory cell region 3 corresponds to, for example, a cross section taken along the line BB' in FIG. 5. The right side from the alternate long and short dash line shows the backing region 4 and illustrates a manufacturing step of the memory cells 1a, 1b. The backing region 4 corresponds to, for example, a cross section taken along the line AA' in FIG. 5.

Figure 7A:
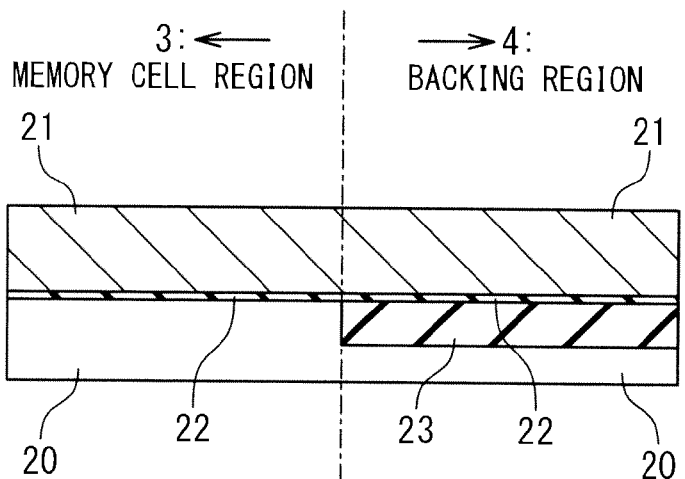
FIGS. 7A to 7C are sectional views each showing step of an embodiment of a manufacturing method of the nonvolatile semiconductor memory according to the present invention.

Referring to FIG. 7A, in a predetermined region on a surface of the p-type silicon semiconductor substrate 20, the isolation region 23 and the isolation region 23' (not shown) are formed in the backing region 4 and the memory cell region 3, respectively, according to a conventional STI (Shallow Trench Isolation) method. A gate insulating film 22 is formed on the surface of the semiconductor substrate 20 by a thermal oxidation treatment. A thickness of the gate insulating film 22 is, for example, 10 nm. Then, a polysilicon film 21 is formed according to the CVD method so as to cover the gate insulating film 22. The polysilicon film 21 becomes the word gate electrodes 30 of the memory cells 1, 1a, and 1b later. A thickness of the polysilicon film 21 is, for example, 200 nm.

Figure 7B:
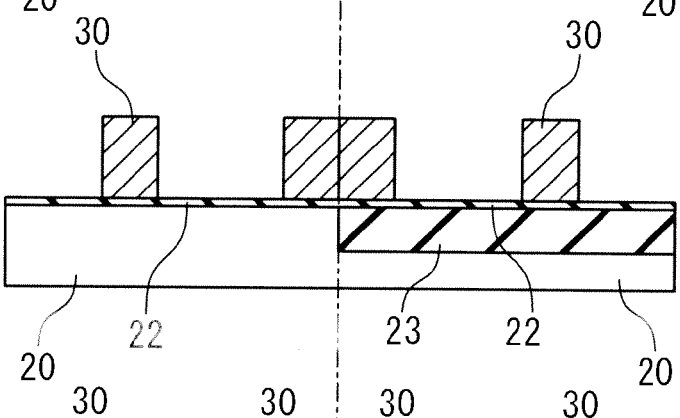

Referring to FIG. 7B, the polysilicon film 21 is etched by photolithography and dry etching process to form the word gate electrodes 30. A surface of the gate insulating film 22 is exposed, where the word gate electrode 30 does not exist.

Figure 7C:
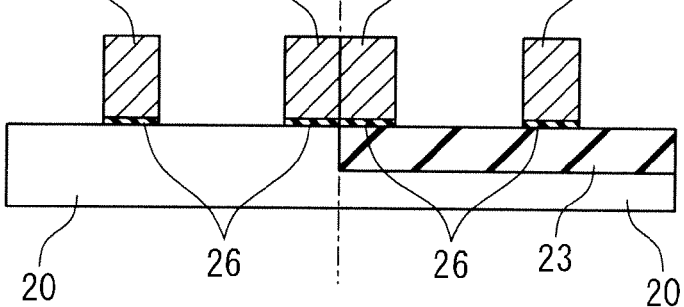

Referring to FIG. 7C, the gate insulating film 22 is shaped to the word gate insulating films 26 by etching using the word gate electrodes 30 as masks. The word gate insulating films 26 are formed immediately under the word gate electrodes 30. The surface of the semiconductor substrate 20 (including the isolation regions 23, 23') is exposed, where the word gate electrode 30 does not exist.

Figure 8A:
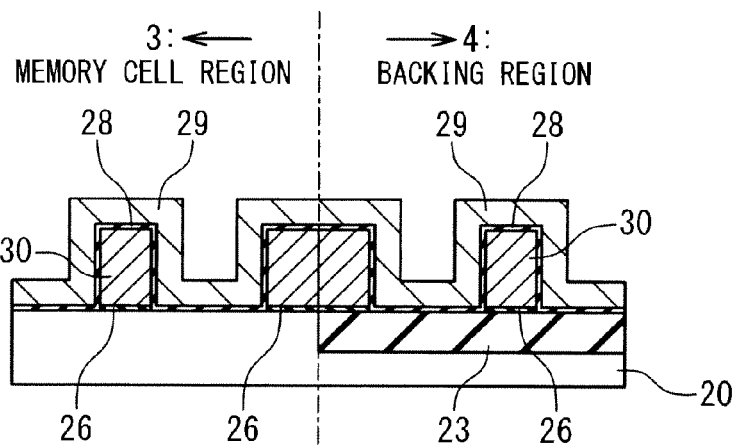
FIGS. 8A to 8C are sectional views each showing step of the embodiment of the manufacturing method of the nonvolatile semiconductor memory according to the present invention.

Referring to FIG. 8A, a silicon oxide film, a silicon nitride film and a silicon oxide film are laminated in this order so as to cover the surfaces of the semiconductor substrate 20 and the word gate electrode 30. The silicon oxide films are formed by using the oxidation method and/or CVD method, and the silicon nitride film are formed by using the CVD method. In this manner, an ONO film 28 as a charge storage layer is formed. Then, a polysilicon film 29 is formed by using the CVD method so as to cover the ONO film 28. The polysilicon film 29 becomes the control gate electrodes 32 later.

Figure 8B:
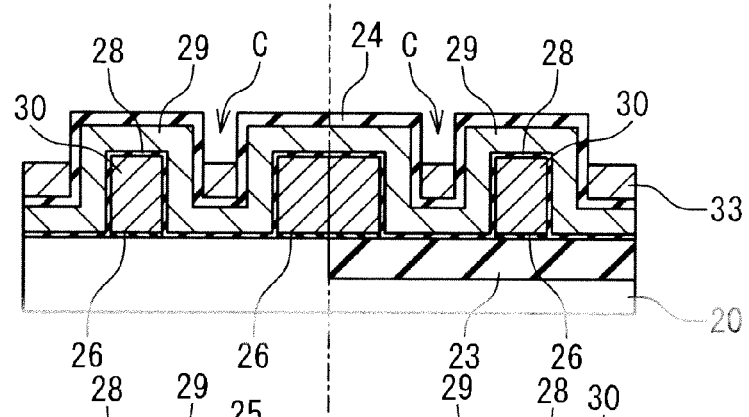

Referring to FIG. 8B, a silicon oxide film 24 is formed by using the CVD method so as to cover the polysilicon film 29. A part of the silicon oxide film 24 becomes the protrusions 37 later. Then, an organic film 33 having a predetermined thickness is formed in a concave portion C formed by the polysilicon film 29 and the silicon oxide film 24 between the word gate electrodes 30. The organic film 33 is, for example, an ARC (Anti Reflective Coating) film. For example, the organic film 33 is formed by a coating process of the ARC film on the silicon oxide film 24 and an etching-back process.

Figure 8C:
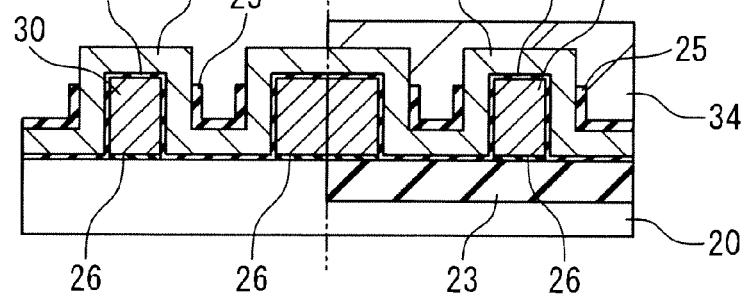

Referring to FIG. 8C, the silicon oxide film 24 is etched back to form an approximately U-like shaped (horseshoe like shaped) hard mask layer 25 which covers a bottom and side surfaces of the concave portion C. The parts covering the side surfaces of the concave portion C in the hard mask layer 25 (sidewall parts of the hard mask layer 25) becomes the protrusions 37 later. As described above, by a thickness of the organic film 33, independently from a thickness of the hard mask layer 25, a height of the protrusion 37 (height of the sidewall parts of the hard mask layer 25) can be controlled. In other words, the thickness and the height of the hard mask layer 25 can be individually set. Then, after removing the organic film 33, the backing region 4 is covered with a resist 34.

Referring to FIG. 9A, the hard mask layer 25 in the memory cell region 3 is etched back to remove the hard mask layer 25 in the memory cell region 3. Then, the resist 34 in the backing region 4 is removed. Thereby, in the memory cell region 3, the surface of the concave portion C of the polysilicon film 29 is exposed. On the other hand, in the backing region 4, the hard mask layer 25 remains on the concave portion C of the polysilicon film 29.

Referring to FIG. 9B, the polysilicon film 29 is etched back to remove the polysilicon film 29 except for the areas surrounding the both side surfaces of the word gate electrode 30. Thereby, in the memory cell region 3, the control gate electrode 32 is formed on the both side surfaces of the word gate electrode 30 through the ONO film 28. On the other hand, in the backing region 4, the control gate electrode 32 is formed on the both side surfaces of the word gate electrode 30 through the ONO film 28. The connection layer 35 for connecting the adjacent control gate electrodes 32 to each other is formed under the hard mask layer 25. When the polysilicon film 29 is etched back, a groove is formed between the sidewall of the hard mask layer 25 and the sidewall of the word gate electrode 30. Since this groove is a very narrow, proceeding of etching in the boundary between the control gate electrode 32 and the connection layer 35 is suppressed, thereby preventing a kink in the area from occurring.

Referring to FIG. 9C, the ONO film 28 and the hard mask layer 25 are etched back to remove the exposed ONO film 28 and a part of the hard mask layer 25. Thereby, a surface of the word gate electrode 30 is exposed. The ONO film 31 is formed between the word gate electrode 30 and the control gate electrode 32, and between the semiconductor substrate 20 and the control gate electrode 32. In addition, in the backing region 4, the hard mask layer 25 corresponding to a bottom part of the concave portion C (a flat part of the hard mask layer 25) is removed and the surface of the connection layer 35 except for its both ends is exposed. The sidewall parts of the hard mask layer 25 remain and become the protrusions 37. An ONO film 39 remains under the connection layer 35. At this time, since the thickness of the hard mask layer 25 is relatively thin, at the same time as etching back of the ONO film 28, the flat part of the hard mask layer 25 can be removed without adding any special step.

Figure 10A:
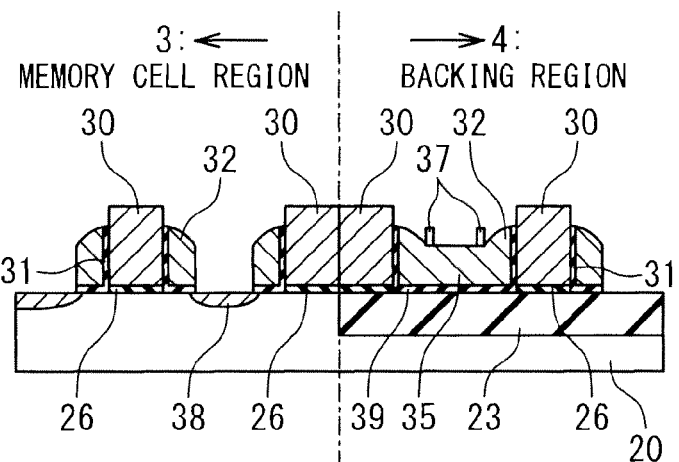
FIGS. 10A to 10C are sectional views each showing step of the embodiment of the manufacturing method of the nonvolatile semiconductor memory according to the present invention.

Referring to FIG. 10A, in the memory cell region 3, using the word gate electrode 30, the ONO film 31 and the control gate electrode 32 as masks, n-type impurities such as arsenic (As) are implanted into the semiconductor substrate 20. As a result, an LDD diffusion layer 38 is formed in a self-aligned manner in the area except for the area immediately under the word gate electrode 30, the ONO film 31 and the control gate electrode 32 and the isolation region (23') on the surface of the semiconductor substrate 20 in the memory cell region 3. In the backing region 4, an ion injection is not performed.

Figure 10B:
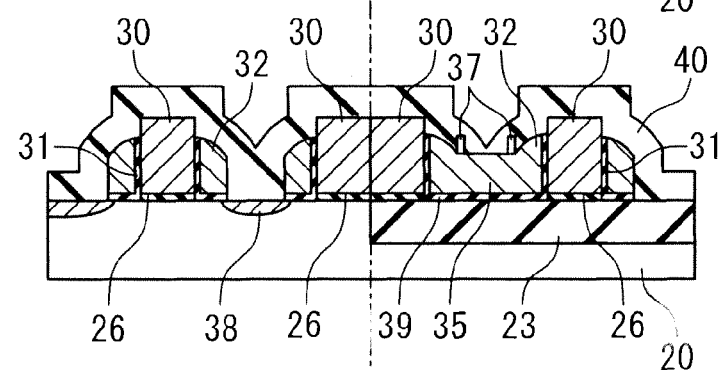

Referring to FIG. 10B, a sidewall insulating film 40 made of silicon oxide is formed by using the CVD method so as to cover the surface of the semiconductor substrate 20, the word gate electrodes 30, the ONO film 31, the control gate electrodes 32, the connection layer 35 and the protrusions 37. The whole surface of the semiconductor substrate 20 is covered with the sidewall insulating film 40.

Figure 10C:
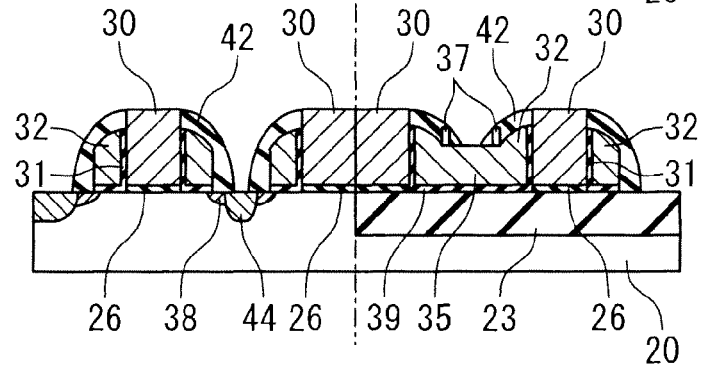

Referring to FIG. 10C, the sidewall insulating film 40 is etched back and the sidewall insulating film 42 is formed on the side surfaces of the word gate electrode 30. At this time, a top surface of the word gate electrode 30 and the center of the top surface of the connection layer 35 are exposed. However, the side surfaces and the top surface of the control gate electrode 32 are covered with the sidewall insulating film 42.

Referring to FIG. 4, in the memory cell region 3, for example, n-type impurities such as arsenic are implanted into the semiconductor substrate 20 using the word gate electrode 30 and the sidewall insulating film 42 as masks. As a result, the source/drain diffusion layer 44 is formed in a self-aligned manner in areas except for the areas immediately under the word gate electrode 30 and the sidewall 42 and the isolation region 23' on the surface of the memory cell region 3 of the semiconductor substrate 20. Then, a cobalt film is formed on the whole surface of the semiconductor substrate 20 by using a sputtering method and subjected to a thermal treatment. By the thermal treatment, the silicide layers 49, 50 are formed (silicidation) in the top surface of the word gate electrode 30 and the surface of the source/drain diffusion layer 44 in the memory cell region 3, respectively. Similarly, the silicide layers 49, 51 are formed (silicidation) in the top surface of the word gate electrode 30 and the surface of the connection layer 35 in the backing region 4, respectively. At this time, since the control gate electrode 32 is covered with the sidewall 42, a silicide is not formed in a surface of the control gate electrode 32. Then, a cobalt film except for the silicide layers is removed by etching.

By the above-described manufacturing steps, the nonvolatile semiconductor memory is manufactured.

Figure 1:
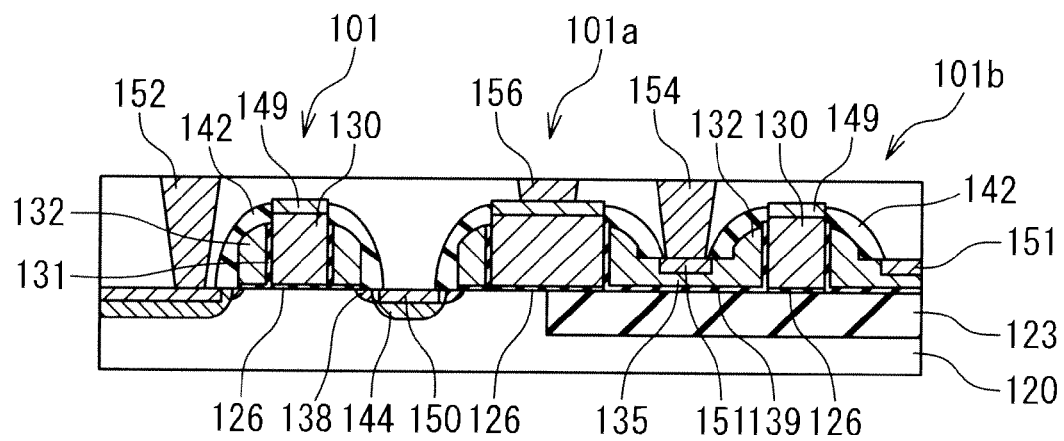
FIG. 1 is a sectional view showing a structure of a memory cell having a twin MONOS structure in JP2002-353346A.
Figure 2A:
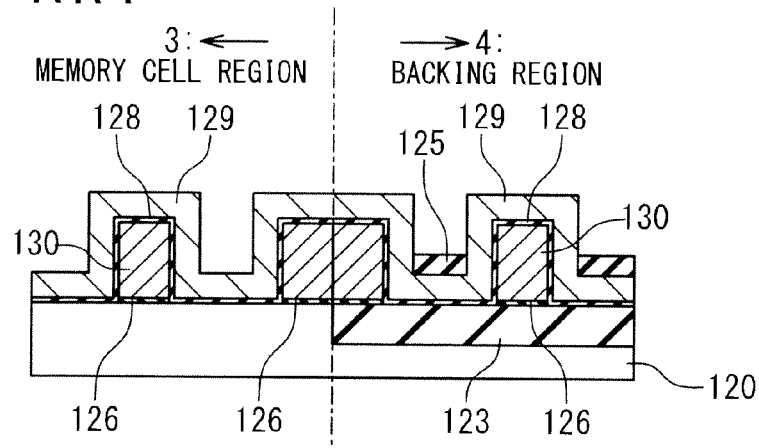
FIGS. 2A to 2B are sectional views each showing a part of a manufacturing step of a memory cell having the disclosed twin MONOS structure.
Figure 2B:
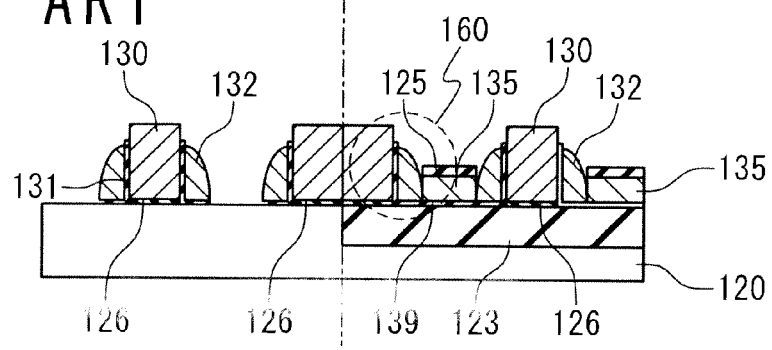
Figure 3:
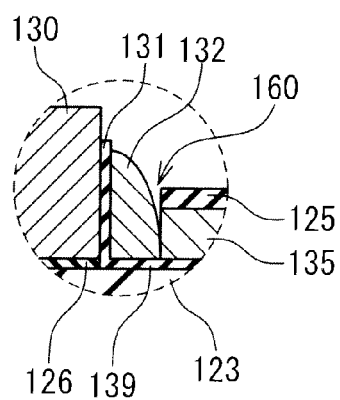
FIG. 3 is an enlarged sectional view of periphery of a control gate electrode in FIG. 2B.

According to the present invention, the hard mask layer 25 is formed between the adjacent word gate electrodes 30 in the backing region 4 so as to cover the bottom surface and the side surfaces of the concave portion C formed of the polysilicon film 29 (FIG. 8C). Although the hard mask layer 25 is thin, it has the bottom part of the concave portion C (flat part of the hard mask layer 25) as well as the protrusions 37 as sidewalls rising from the bottom part (parts covering the side surfaces of the concave portion C, that is, the sidewall parts of the hard mask layer 25). The protrusions 37 achieve the same effect as the fact that the thickness of the hard mask layer 25 becomes thick with respect to the polysilicon film 29 when the polysilicon film 29 is etched back (FIG. 9B). That is, since a groove is formed between the protrusion 37 and the sidewall of the word gate electrode 30, etching at the region which is formed on the groove and becomes the control gate electrode 32 is hard to proceed. As a result, it is possible to prevent occurrence of the kink (the kink 160 in FIG. 3) due to etching at the region. In addition, since the thickness of the hard mask layer 25 only needs to be relatively thin, at the same time as etching back of the ONO film 28, the upper surface of the connection layer 35 can be exposed (FIG. 9C). Thereby, the silicide layer can be formed on the upper surface of the connection layer 35 at a subsequent step without adding any special step (FIG. 4). This is due to that, as described in FIG. 8C, according to the manufacturing method of the present invention, the height and the thickness of the hard mask layer 25 can be individually set. In the present invention, the nonvolatile semiconductor memory may be included in an embedded memory LSI (semiconductor device).

According to the present invention, by preventing occurrence of the kink between the connection layer 35 extending between the adjacent control gate electrodes 32 and the control gate electrode 32, an electrical connection between the connection layer 35 and the control gate electrode 32 can be ensured. Furthermore, the silicide layer can be formed on a connection part between the connection layer 35 and the contact 54 without adding any step. Therefore, a satisfactory backing can be formed.

It is apparent that the present invention is not limited to the above embodiment, but may be modified and changed without departing from the scope and spirit of the invention.

The invention claimed is:

1. A manufacturing method of a nonvolatile semiconductor memory comprising:
   (a) laminating a second insulating film, a gate film and a hard mask film in this order which cover a first gate electrode of a first memory cell transistor formed over a first region of a semiconductor substrate through a first insulating layer and a third gate electrode of a second memory cell transistor formed over a second region of said semiconductor substrate through said first insulating layer;
   (b) forming a first hard mask layer which covers a bottom portion and a side surface of a concave portion formed using said gate film between said first gate electrode and said third gate electrode by etching said hard mask film; and
   (c) forming a second gate electrode of said first memory cell transistor over said first region, a fourth gate electrode of said second memory cell transistor over said second region, and a connection layer which connects said second gate electrode and said fourth gate electrode under said first hard mask layer by etching said gate film; and
   (d) exposing an upper portion of said connection layer by etching back said first hard mask layer covering a bottom portion of said concave portion to remain said first hard mask layer such that said first hard mask layer covers side surfaces of said concave portion.

2. The manufacturing method of the nonvolatile semiconductor memory according to claim 1, wherein said step (d) includes:

(d1) exposing upper portions of said first gate electrode and said third gate electrode in addition to said upper portion of said connection layer by etching back said second insulating film and said first hard mask layer covering said bottom portion of said concave portion to remain said first hard mask layer such that said first hard mask layer covers side surfaces of said concave portion.

3. The manufacturing method of the nonvolatile semiconductor memory according to claim 2, further comprising:
(e) forming a silicide layer in an upper portion of said connection layer.

4. The manufacturing method of the nonvolatile semiconductor memory according to claim 2, further comprising:
(f) forming a sidewall insulating film which covers said second gate electrode of said first memory cell transistor and said fourth gate electrode of said second memory cell transistor.

5. The manufacturing method of the nonvolatile semiconductor memory according to claim 2, further comprising:
(g) forming an isolation region in said first region and said second region of a surface portion of said semiconductor substrate.

6. The manufacturing method of the nonvolatile semiconductor memory according to claim 2, wherein said step (a) includes:
(a1) laminating said second insulating film, said gate film and said hard mask film which cover a fifth gate electrode of a third memory cell transistor formed on a third region of said semiconductor substrate through said first insulating layer and a seventh gate electrode of a fourth memory cell transistor formed on a fourth region of said semiconductor substrate through said first insulating layer, said step (b) includes:
(b1) forming a second hard mask layer which covers a bottom portion and a side surface of said concave portion formed using said gate film between said fifth gate electrode and said seventh gate electrode by etching said hard mask film, said step (c) includes:
(c1) removing said second hard mask layer by etching, and
(c2) forming a sixth gate electrode of said third memory cell transistor on said third region, and a eighth gate electrode of said fourth memory cell transistor on said fourth region by etching said gate film, said step (d) includes:
(d1) exposing upper portions of said fifth gate electrode and said seventh gate electrode by etching back said second insulating film, wherein said sixth gate electrode and said eighth are isolated from each other, said first gate electrode and said fifth gate electrode, said second gate electrode and said sixth gate electrode, said third gate electrode and said seventh gate electrode, and, said fourth gate electrode and said eighth gate electrode are unified, respectively.

7. The manufacturing method of the nonvolatile semiconductor memory according to claim 1, wherein said step (c) includes:
(c3) forming two of said second gate electrodes on both sides of said first gate electrode and two of said fourth gate electrodes on both sides of said third gate electrode.

* * * * *